ENERGY STORAGE DEVICE

Filed April 10, 1958

INVENTOR
ALEXANDER LEMPICKI
BY Theodore Jay Jr.
ATTORNEY

United States Patent Office 3,059,115 Patented Oct. 16, 1962

3,059,115

ENERGY STORAGE DEVICE

Alexander Lempicki, Forest Hills, N.Y., assignor, by mesne assignments, to Sylvania Electric Products Inc., Wilmington, Del., a corporation of Delaware Filed Apr. 10, 1958, Ser. No. 727,688
1 Claim. (Cl. 250—208)

Figure 1:
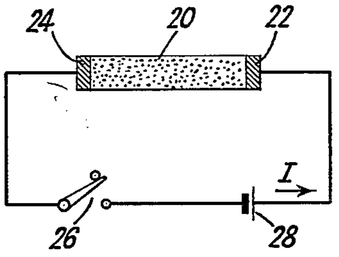

My invention relates to energy storage devices.

It is an object of my invention to provide new and improved light-sensitive devices for storing energy when electrically actuated and for releasing the stored energy when stimulated by a light signal.

A further object is to provide a new and improved light-sensitive cell which is triggered from a first electrical state to a second electrical state when electrically actuated and which is triggered from said second state to said first state upon subsequent stimulation of said cell by a light signal.

Still a further object is to provide a new and improved light-sensitive device composed of a plurality of light-sensitive cells, each cell being adapted to store energy when electrically actuated and to release the stored energy when stimulated by a light signal.

These and other objects of the invention will either be explained or will become apparent hereinafter.

In accordance with the principles of my invention, I provide a light-sensitive cell which is constituted by a light-sensitive semiconductor element having first and second spaced apart electrodes in electrical contact therewith. The cell is characterized by first and second mutually exclusive electric states, the first state being designated as an unpolarized state, the second state being designated as a polarized state. Means coupled between the electrodes trigger the cell from the first state to the second state and thus supplies electrical energy to the cell which is stored therein. The cell, when in its second state, is triggered into its first state upon stimulation by a light signal. The energy stored in the cell, when in its second state, is released (in the form of an electrical output signal) when the cell returns from the second state to the first state.

I further provide a first array of coplanar, parallel, separated electrical conductors extending in a first direction, and a second array of coplanar, parallel, separated electrical conductors extending in a second direction. The two arrays lie in separated, parallel planes, the conductors in at least one of the arrays being light-transparent. At each point at which a first array conductor crosses over a second array conductor, I interpose a light-sensitive semiconductor element of the type described above, between the first array and second array conductors, the element being in electrical contact with both conductors at this point. Thus, a light-sensitive cell is formed at each of these points.

Means coupled between a selected first array conductor and a selected second array conductor trigger the cell formed at the cross-over point of these conductors into its second state as before. The cell, when in its second state, is triggered into its first state upon stimulation of a light signal, the signal impinging upon the light-transparent conductor of the appropriate first array-second array conductor pair. Each cell can be caused to successively store and release energy by switching or commutating the triggering means and the light signal to actuate each conductor pair in a predetermined sequence.

Figure 2:
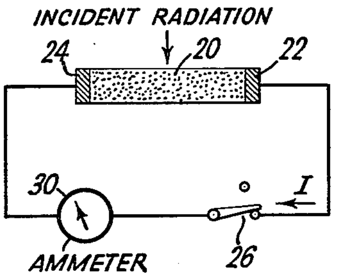
Figure 3:
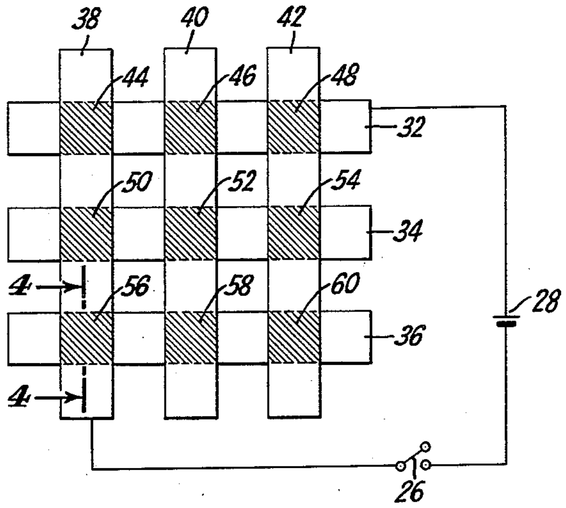
Figure 4:
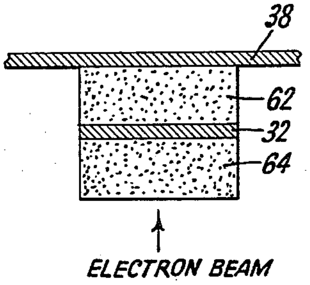

Illustrative embodiments of my invention will now be described with reference to the accompanying drawings wherein:

FIGS. 1 and 2 are circuit diagrams of an embodiment of my invention utilizing a single light-sensitive cell; and FIGS. 3 and 4 are front and side views of another embodiment of my invention utilizing a plurality of light-sensitive cells.

Referring now to FIG. 1, there is provided a light-sensitive cell constituted by a light-sensitive semiconductor element 20 having first and second electrodes 24 and 22 in electrical contact with opposite ends of the element. The first electrode 24 is connected, through an open switch 26, to one side of battery 28; the second contact 22 is directly connected to the other side of battery 28.

When switch 26 is open, the device is in its first or unpolarized electrical state. When the device is placed in the dark and switch 26 is closed, a unidirectional signal is applied to the device; when the battery 28 has the polarity indicated, a current I flows in the circuit with the direction indicated in FIG. 1. After several seconds, the electrodes are short-circuited by directly connecting them together through the closed switch 26, and the battery 28 is disconnected. The device is then in its second or polarized electric state. The energy carried by the applied signal is then stored in the device.

When the device is subsequently irradiated by incident ultraviolet, infrared, or visible light, as shown in FIG. 2, an electrical output signal of opposite polarity to the original applied signal is momentarily produced, and an output signal, in this example current I, flows momentarily in the circuit. The direction of current flow is reversed as compared to the direction of current flow of FIG. 1 (and as illustrated by the position of the pointer of ammeter 30 in FIG. 2). Hence, the energy previously stored is released in the form of an output signal, and the device is returned from its second state to its first state.

Element 20 can be, for example, a single crystal of zinc sulfide. More particularly, I have employed a single crystal of zinc sulfide having a cross sectional area of about 0.02 square centimeter and a length of about 0.05 centimeter. I applied a voltage to this crystal for a period of about 10 seconds, the voltage being such as to establish a voltage gradient of about 1000 volts per centimeter within the crystal. I then short-circuited the crystal electrodes. Several hours later, I illuminated the crystal with light from a mercury lamp, the emitted light having a wavelength of about 3650° A. and an intensity of about 100 microwatts per square centimeter. The output voltage was found to be about 10 volts, and the reverse current flow was found to be about 100 micro-micro-amperes.

Referring now to FIG. 3, there is shown a plurality of separated, horizontal, coplanar, parallel, transparent electrical conductors 32, 34, 36 and a plurality of separated, vertical, coplanar, parallel, transparent electrical conductors 38, 40 and 42. Each vertical conductor crosses each horizontal conductor at a corresponding cross-over point, i.e. at points 44, 46, 48, 50, 52, 54, 56, 58 and 60. A small rectangular shaped body of light-sensitive semiconductor material is located at each point and is interposed between and in electrical contact with the appropriate horizontal and vertical conductor. Each rectangle together with its associated conductors represents an element 20 with electrodes 24 and 22, as shown in FIGS. 1 and 2, and can be caused to store and release energy in the same manner. Hence, by applying a suitable potential between any particular horizontal-vertical conductor pair while in the dark and then short-circuiting the conductor pair, the cell defined by the corresponding junction can be placed in its second state. As before, a light signal impinging upon a transparent conductor of this pair will trigger the cell into the first state and release energy in the form of an output signal as before.

Further, by switching or commutating the applied potentials and the light signal in known manner, each cell can be caused to store or release energy successively. With the arrangement thus far described, a light signal must be successively directed upon each cross-over point in turn to cause the cells to release energy successively. However, a separate, ultra-violet emitting phosphor coating can be applied over each cross-over point, and the entire assembly can then be scanned by an electron beam. For example, the assembly can be placed in a cathode ray tube in the path of an electron beam and scanned in conventional manner. Under these conditions, the light emitted by any phosphor coating, when struck by an electron beam, can cause the cell located at the corresponding junction to release its energy in the manner previously described.

A cross sectional view of an arrangement incorporating such phosphor coatings is shown in FIG. 4, wherein at any cross-over point, for example point 44 of FIG. 3, there is provided a phosphor coating 64, horizontal conductor 32, a light-sensitive semiconductor element 62 and a vertical conductor 38.

While I have shown and pointed out my invention as applied above, it will be apparent to those skilled in the art that many modifications can be made within the scope and sphere of my invention.

What is claimed is:

In combination, a first array of parallel, separated, coplanar, electrical conductors extending in a horizontal direction, said first array conductors being electrically isolated from each other; a second array of parallel, separated, coplanar, light-transparent, electrical conductors extending in a vertical direction, said second array conductors being electrically isolated from each other and from the conductors of said first array, said first and second array conductors lying in separated parallel planes; and a plurality of separate, light-sensitive semiconductor elements, one semiconductor element being positioned at each point at which a first array conductor crosses over a second array conductor and being interposed between and in electrical contact with the first and second array conductors at said point, each element having a uniform chemical composition, each of said semiconductor elements having first and second mutually exclusive electric states; means coupled between a selected first array conductor and a selected second array conductor to place the corresponding semiconductor element at the corresponding point in said second state; and means to direct a light signal upon said selected second array conductor at said corresponding point when the corresponding semiconductor element is in its second state whereby said corresponding semiconductor element is triggered into said first state, said means including a plurality of phosphor elements, one phosphor element being located at each of said points on top of one of said first and second array conductors whereby each phosphor element is separated from its corresponding semiconductor element by said one of said first and second array conductors.

References Cited in the file of this patent

UNITED STATES PATENTS

| | | |
|---|---|---|
| 2,698,915 | Piper | Jan. 4, 1955 |
| 2,743,430 | Schultz et al. | Apr. 24, 1956 |
| 2,789,193 | Anderson | Apr. 16, 1957 |
| 2,813,957 | Gosling | Nov. 19, 1957 |
| 2,897,399 | Garwin et al. | July 28, 1959 |
| 2,911,539 | Tanenbaum | Nov. 3, 1959 |
| 2,912,592 | Mayer | Nov. 10, 1959 |
| 2,932,770 | Livingston | Apr. 12, 1960 |